US010403514B1

(12) United States Patent
Hagino et al.

(10) Patent No.: US 10,403,514 B1
(45) Date of Patent: Sep. 3, 2019

(54) SUBSTRATE TRANSPORTING SYSTEM, STORAGE MEDIUM AND SUBSTRATE TRANSPORTING METHOD

(71) Applicant: ASM IP Holding B.V., Almere (NL)

(72) Inventors: Takashi Hagino, Kawasaki (JP); Masaei Suwada, Nagaoka (JP)

(73) Assignee: ASM IP Holding B.V., Almere (NL)

( * ) Notice: Subject to any disclaimer, the term of this patent is extended or adjusted under 35 U.S.C. 154(b) by 12 days.

(21) Appl. No.: 15/951,882

(22) Filed: Apr. 12, 2018

(51) Int. Cl.
*H01L 21/67* (2006.01)
*H01L 21/677* (2006.01)

(52) U.S. Cl.
CPC .. *H01L 21/67017* (2013.01); *H01L 21/67772* (2013.01); *H01L 21/67775* (2013.01)

(58) Field of Classification Search
CPC .................... H01L 21/67772; H01L 21/67745
See application file for complete search history.

(56) References Cited

U.S. PATENT DOCUMENTS 6,461,094 B1 * 10/2002 Mages .............. H01L 21/67769 414/217
6,837,663 B2 * 1/2005 Mages .............. H01L 21/67769 414/217
7,585,144 B2 * 9/2009 Bonora ............. H01L 21/67772 414/217
7,597,523 B2 * 10/2009 Bonora ............. H01L 21/67775 414/217
8,186,927 B2 * 5/2012 Okabe ............... H01L 21/67772 414/217.1
9,607,871 B2 * 3/2017 Iwamoto ........... H01L 21/67017
9,627,237 B2 * 4/2017 Matsumoto ....... H01L 21/67259
9,666,464 B2 * 5/2017 Kikuchi ............ H01L 21/67775
10,090,182 B2 * 10/2018 Okabe ............... H01L 21/02046
10,096,504 B2 * 10/2018 Oyama ............. H01L 21/67389
2002/0006322 A1 * 1/2002 Perlov ............... H01L 21/67196 414/217
2002/0124960 A1 * 9/2002 Nakashima ............. C23C 16/54 156/345.31
2004/0099826 A1 * 5/2004 Igarashi ................... G01V 8/12 250/559.29
2005/0201854 A1 * 9/2005 Kisakibaru ....... H01L 21/67017 414/222.01
2006/0285944 A1 * 12/2006 Evans ............... H01L 21/67772 414/217
2007/0066204 A1 * 3/2007 Tanimura .......... H01L 21/67017 454/65
2008/0008570 A1 * 1/2008 Rogers .............. H01L 21/67772 414/292
2009/0169342 A1 * 7/2009 Yoshimura ........ H01L 21/67772 414/217

(Continued)

FOREIGN PATENT DOCUMENTS

| | | | |
|---|---|---|---|
| JP | 3425592 | B2 | 7/2003 |
| JP | 2006-128153 | A | 5/2006 |

*Primary Examiner* — Kaitlin S Joerger
(74) *Attorney, Agent, or Firm* — Studebaker & Brackett PC

(57) ABSTRACT

Examples of a substrate transporting system include a substrate transporting robot, a module that houses the substrate transporting robot therein and has an EFEM door, a load port for placing a FOUP having a FOUP door thereon, and a controller for opening the EFEM door while the FOUP door is closed when the FOUP is located at a dock position of the load port.

10 Claims, 6 Drawing Sheets

(56) References Cited

U.S. PATENT DOCUMENTS

| | | | | |
|---|---|---|---|---|
| 2010/0243867 | A1* | 9/2010 | Suzuki | H01L 21/67265 250/215 |
| 2014/0157722 | A1* | 6/2014 | Iwamoto | H01L 21/67772 53/111 R |
| 2015/0179490 | A1* | 6/2015 | Yamamoto | H01L 21/67276 438/800 |
| 2015/0214078 | A1* | 7/2015 | Iwamoto | H01L 21/67017 414/304 |
| 2016/0147235 | A1* | 5/2016 | Rice | H01L 21/67775 700/282 |
| 2016/0260627 | A1* | 9/2016 | Nakano | H01L 21/67389 |
| 2016/0260628 | A1* | 9/2016 | Ochiai | H01L 21/67772 |
| 2017/0178942 | A1* | 6/2017 | Sakata | H01L 21/67389 |
| 2018/0204753 | A1* | 7/2018 | Kawai | H01L 21/677 |
| 2018/0229945 | A1* | 8/2018 | Suzuki | B65G 49/00 |
| 2018/0233392 | A1* | 8/2018 | Abe | H01L 21/67769 |
| 2018/0366355 | A1* | 12/2018 | Koshti | H01L 21/67248 |
| 2018/0374733 | A1* | 12/2018 | Pannese | H01L 21/67769 |

* cited by examiner

SUBSTRATE TRANSPORTING SYSTEM, STORAGE MEDIUM AND SUBSTRATE TRANSPORTING METHOD

TECHNICAL FIELD

Examples are described which relate to a substrate transporting system, a storage medium and a substrate transporting method.

BACKGROUND

Patent Literature 1 (JP 2006-128153) discloses that a gas supply pipe is disposed at an upper portion of an opening portion inside of a FIMS, and cleaning gas is sprayed from the pipe onto the upper surface of a wafer housed in a pod to remove contaminants, etc. from the wafer.

In a semiconductor manufacturing process, for example, a Front-Opening Unified Pod (FOUP) is placed on a load port, and a substrate is taken out from the FOUP or put into the FOUP. For example, a Front-Opening Interface Mechanical Standard (FIMS) is used to take out a substrate from the FOUP or put the substrate into the FOUP. If a component such as oxygen or water infiltrates into the FOUP, the environment in the FOUP is contaminated or the substrate in the FOUP is contaminated.

SUMMARY

Some examples described herein may address the above-described problems. Some examples described herein may provide a substrate transporting system, a storage medium and a substrate transporting method that can suppress contamination of the inside of a FOUP.

In some examples, a substrate transporting system includes a substrate transporting robot, a module that houses the substrate transporting robot therein and has an EFEM door, a load port for placing a FOUP having a FOUP door thereon, and a controller for opening the EFEM door while the FOUP door is closed when the FOUP is located at a dock position of the load port.

DETAILED DESCRIPTION

A substrate transporting system, a storage medium and a substrate transporting method according to an embodiment will be described with reference to the drawings. The same or corresponding constituent elements are represented by the same reference signs, and repetitive descriptions thereof may be omitted.

(System Configuration)

Figure 1:
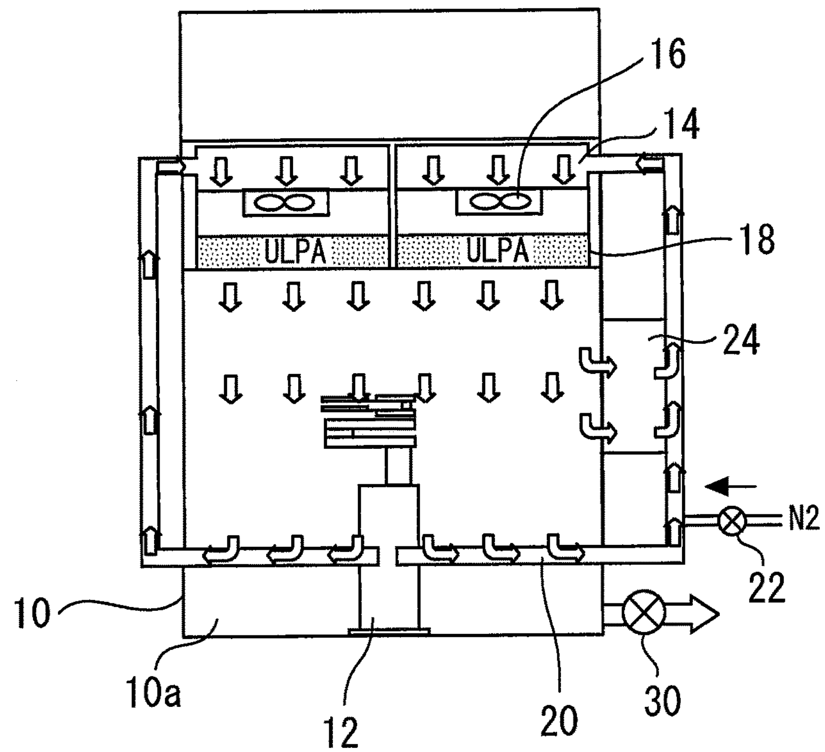
FIG. 1 is a front view of an Equipment Front End Module.

FIG. 1 is a front view of an Equipment Front End Module (EFEM). FIG. 1 represents the inside of the EFEM. This EFEM has a housing 10 for providing a space 10*a* therein, and a substrate transporting robot 12 is housed in the housing 10. A blow-out portion 14 for blowing out inert gas is provided at an upper portion of this module, and a fan 16 is provided below the blow-out portion 14. The inert gas is passed through an ULPA filter 18 and then supplied into the space 10*a* by the fan 16.

The inert gas reaching the lower portion of the space 10*a* is taken into a circulation duct 20, and then reaches the blow-out portion 14 again. As described above, down-flow of inert gas can be generated in the space 10*a*. If necessary, a line for supplying inert gas to the circulation duct 20 may be provided such that the line can be opened and closed by a valve 22. Furthermore, if necessary, a line for exhausting gas in the space 10*a* to the outside may be provided such that the line can be opened and closed by a valve 30. The foregoing configuration provides a circulation device for circulating inert gas into the module. Another circulation device for circulating inert gas into the module may be adopted. Furthermore, inert gas is not circulated, but inert gas may be periodically exchanged or the whole amount of inert gas may be exhausted.

Figure 2:
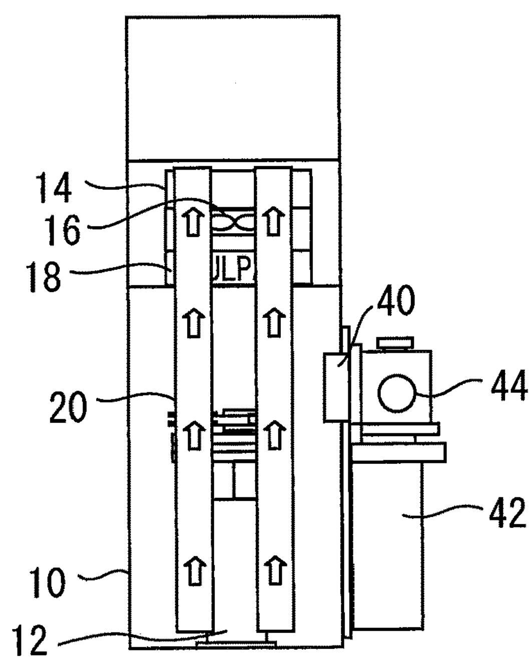
FIG. 2 is a side view of the EFEM.

FIG. 2 is a side view of the EFEM. FIG. 2 shows the inside of the EFEM like FIG. 1. This module is provided with a FIMS door 40. The FIMS door 40 is an example of an EFEM door. An EFEM door which does not conform to the FIMS may be used in place of the FIMS door 40. A load port 42 is provided on a side of the housing 10. The load port 42 may used to place a FOUP 44 having a FOUP door thereon.

Figure 3:
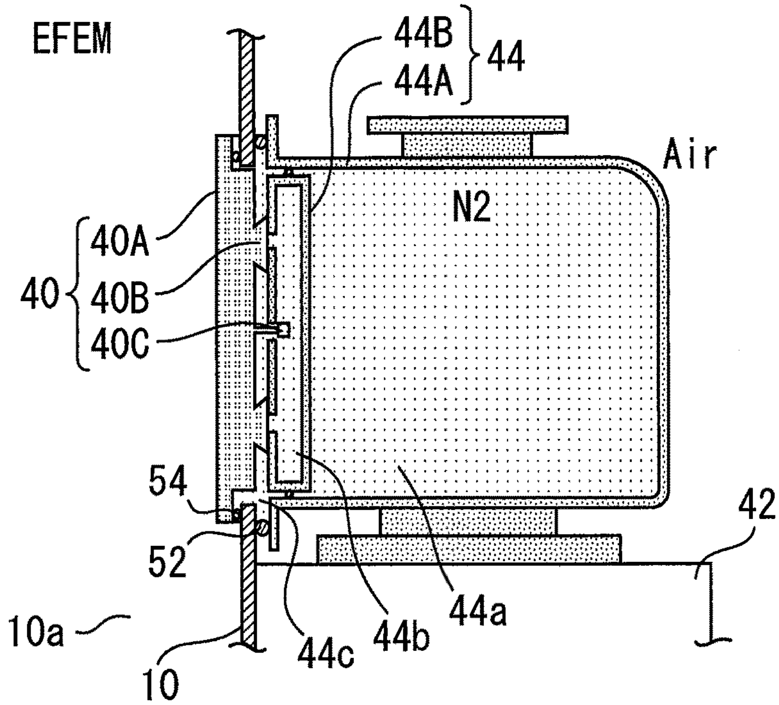
FIG. 3 is a cross-sectional view showing the FIMS door and the FOUP.

FIG. 3 is a cross-sectional view showing exemplary configurations of the FIMS door 40 and the FOUP 44. The FOUP 44 has a main body 44A and a FOUP door 44B. A housing space 44*a* for housing a substrate is provided by the main body 44A. The FOUP door 44B has, for example, a box-type shape for providing a first space 44*b* therein. There is air in the first space 44*b* of the FOUP 44 moved from a clean room. For example, air containing about 21% oxygen may be contained in the first space 44*b*.

When the FOUP door 44B is closed, the housing space 44*a* becomes a closed space. The main body 44A and the FOUP door 44B are in contact with each other, for example, through a packing. The main body 44A of the FOUP 44 located at a dock position is in contact with the housing 10, for example, through an elastically deformed O-ring 52. When the FOUP 44 is located at the dock position, a second space 44*c* exists between the FOUP door 44B and the FIMS door.

Under the state that the FIMS door 40 is closed, the FIMS door 40 is opposite to the FOUP door 44B. The FIMS door 40 includes a main body 40A, a suction pad 40B and a latch key 40C. The suction pad 40B is, for example, a vacuum suction mechanism which is adapted to be sucked to the FOUP door 44B. Under the state that the FIMS door 40 is closed, the main body 40A is in contact with the inner wall of the housing 10 through an elastically deformed O-ring 54. O-rings 52 and 54 may be replaced with another sealing parts.

(Substrate Transporting Method)

First, a FOUP 44 is placed at an undock position on the load port 42 by Overhead Transfer (OHT). At this time, inert gas such as nitrogen gas may be supplied from the load port 42 into the housing space 44*a* of the FOUP 44 to purge the housing space 44*a*. For example, gas in the housing space 44*a* is exhausted to the outside through a hole which is formed in the bottom surface of the main body 44A so as to be openable and closable while inert gas is supplied into the housing space 44*a* through another hole which is formed in the bottom surface of the main body 44A so as to be openable and closable.

Subsequently, as shown in FIG. 3, the FOUP 44 placed on the load port 42 is moved to the dock position, thereby positioning the FOUP door 44B and the FIMS door 40 opposite to each other. As a result, the O-ring 52 is interposed and elastically deformed between the FOUP 44 and the housing 10.

Figure 4:
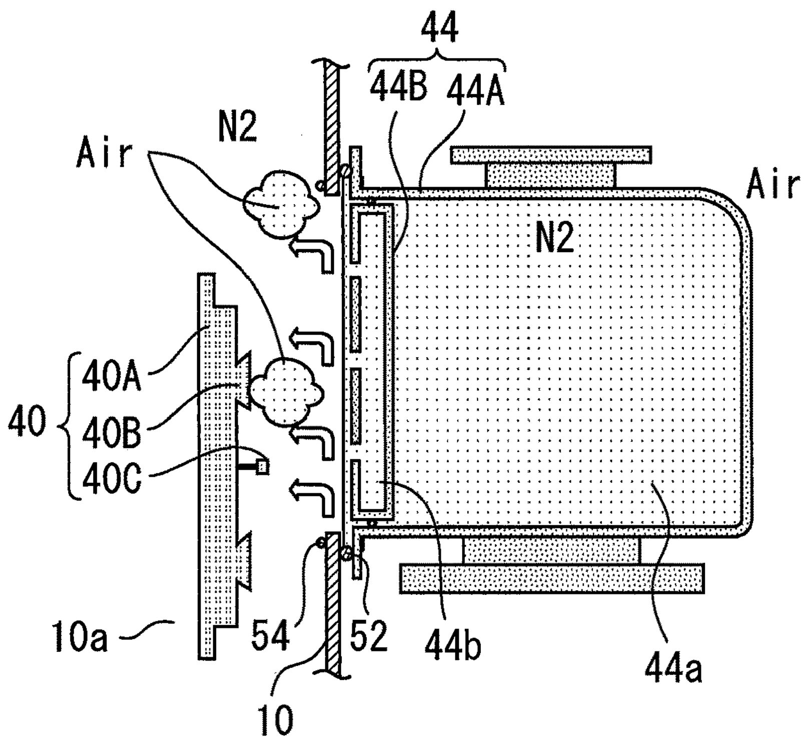
FIG. 4 shows that the FIMS door is opened.

Subsequently, only the FIMS door 40 is opened. FIG. 4 shows that the FIMS door 40 is opened under the state that the FOUP door 44B is closed. When only the FIMS door 40 is opened, the space serving as the first space 44*b* and the second space 44*c* intercommunicates with the space 10*a* of the housing 10. As a result, gas in the first space 44*b* and the second space 44*c* is replaced with inert gas such as nitrogen in the space 10*a* into which the inert gas is circulated. For example, gases such as oxygen and water in the first space 44*b* and the second space 44*c* are replaced with inert gas such as nitrogen gas. During this processing, the FOUP door 44B is closed, so that the gases such as oxygen and water in the first space 44*b* and the second space 44*c* are prevented from infiltrating into the housing space 44*a*.

Figure 5:
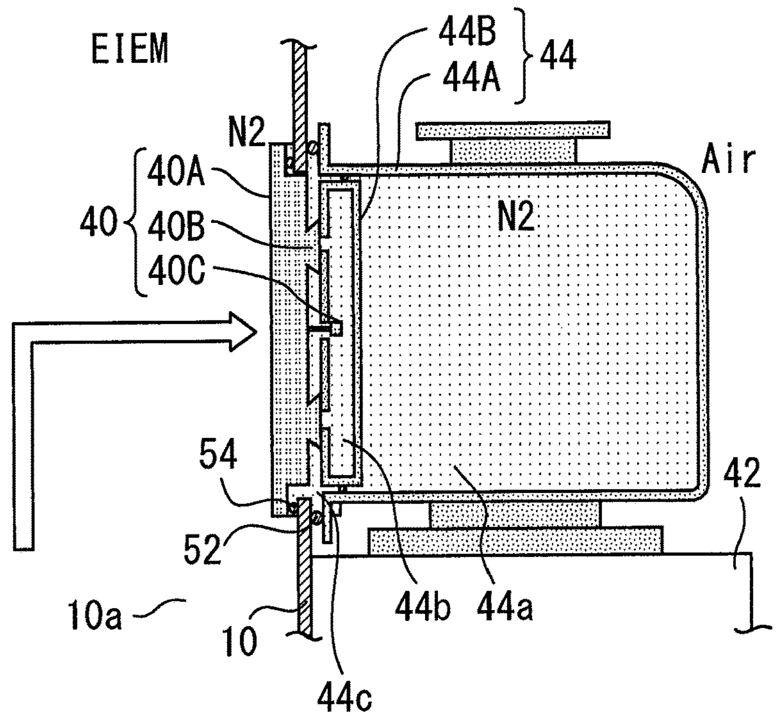
FIG. 5 shows that the FIMS door has been closed.

Subsequently, the FIMS door 40 is closed. FIG. 5 shows that the FIMS door 40 has been closed. At this time, inert gas such as nitrogen gas is filled in the first space 44*b* and the second space 44*c*.

Figure 6:
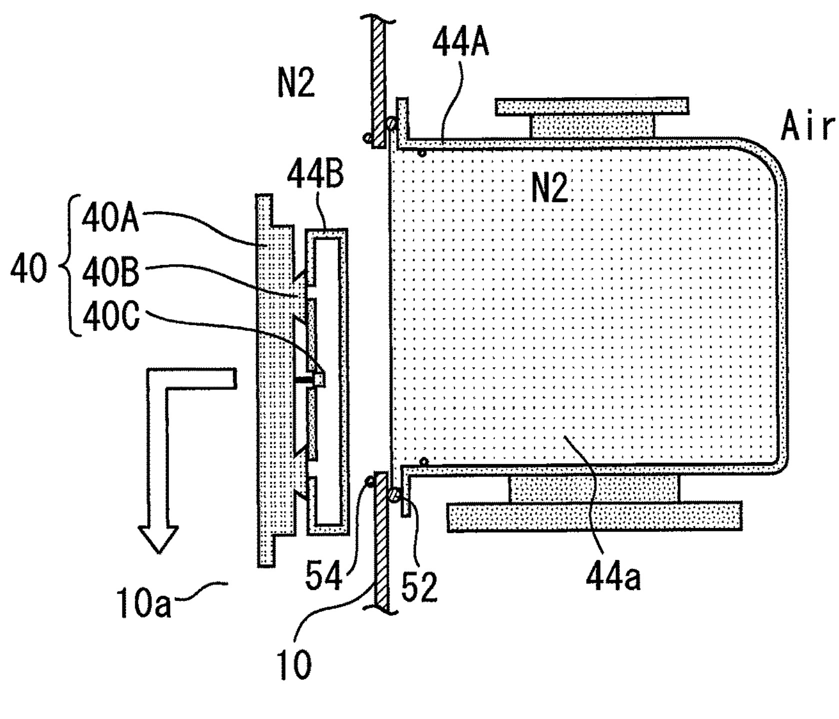
FIG. 6 shows that the FIMS door and the FOUP door are opened.

Subsequently, the FIMS door 40 and the FOUP door 44B are opened. FIG. 6 shows that the FIMS door 40 and the FOUP door 44B are opened. Specifically, the FIMS door 40 is fixed to the FOUP door 44B, for example, by the suction pad 40B, and the FIMS door 40 and the FOUP door 44B are opened. Furthermore, when the FIMS door 40 and the FOUP door 44B are opened, latch release based on the latch key 40C is also performed.

The FIMS door 40 integrated with the FOUP door 44B is moved downwards to make the housing space 44*a* and the space 10*a* intercommunicate with each other. Following opening of the door, a certain amount of inert gas in the space serving as the first space 44*b* and the second space 44*c* is supplied to the space 10*a* of the housing 10. Subsequently, the substrate in the FOUP 44 is moved into the housing 10 by a substrate transporting robot 12 shown in FIG. 1. Or, the substrate is transported into the FOUP 44.

By opening only the FIMS door 40 before the FOUP door 44B is opened as described above, gas serving as a contamination source such as oxygen or water in the first space 44*b* and the second space 44*c* can be replaced with inert gas. Therefore, the inside of the FOUP 44 can be prevented from being contaminated by oxygen, water or the like when the FOUP door 44B is opened. Furthermore, the FOUP door 44B may be opened after it is confirmed that the concentrations of oxygen and water in the space 10*a* are smaller than predetermined values.

Figure 7:
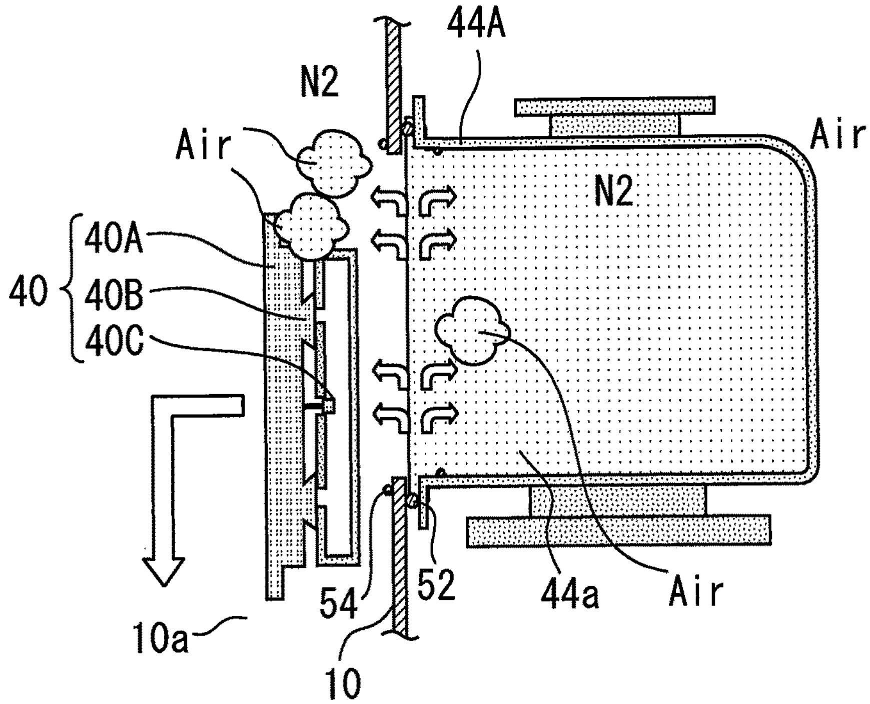
FIG. 7 is a diagram showing that the FOUP door is opened.

FIG. 7 is a diagram showing that the FOUP door 44B is opened without replacing the gas in the first space 44*b* and the second space 44*c* with inert gas. In this case, the contamination source such as oxygen or water in the first space 44*b* and the second space 44*c* infiltrates into the housing space 44*a*, resulting in contamination of the inside of the FOUP 44. However, this problem can be solved by providing the processing of opening only the FIMS door 40.

The space to be purged in the step of opening only the FIMS door 40 which is described with reference to FIG. 4 is not limited to the first space 44*b* and the second space 44*c*. Depending on the configuration of the substrate transporting system, only one of the first space 44*b* and the second space 44*c* may exist, or a space different from the first space 44*b* and the second space 44*c* may exist. The contamination source in these spaces can be purged by providing the step of opening only the FIMS door 40. Furthermore, the contamination source is not limited to oxygen or water, but all gases which are considered to be undesirable to touch a substrate inside a FOUP are applicable as the contamination source.

The configuration of the substrate transporting system for realizing the processing as described above may be freely changed insofar as the foregoing action can be obtained. Each processing described above does not require any change of the configuration of the substrate transporting system, and can be realized by only a change on the specification of operations.

(Increase/Reduction of Oxygen Concentration)

Figure 8:
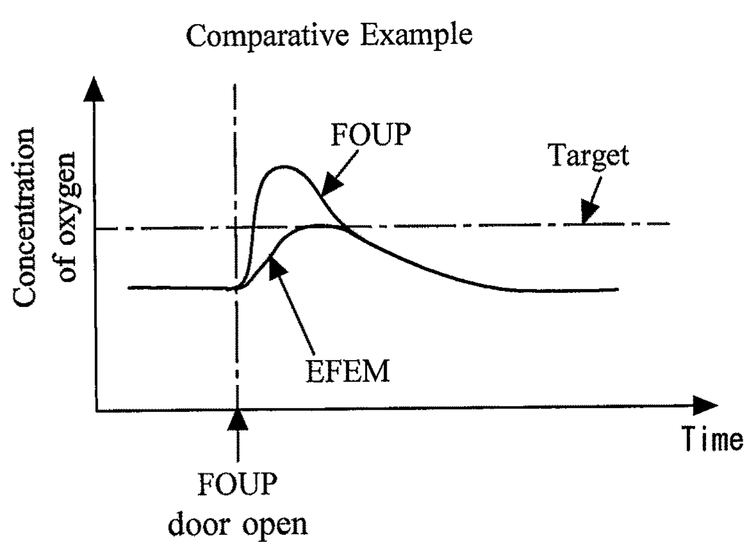
FIG. 8 is a diagram showing a transition of the concentration of oxygen.

FIG. 8 is a diagram showing a transition of the concentration of oxygen in the FOUP when the FOUP door 44B is opened without passing through the step of opening only the FIMS door 40. The curve labeled "FOUP" in FIG. 8 shows a transition of the concentration of oxygen in FOUP. The curve labeled "EFEM" in FIG. 8 shows a transition of the concentration of oxygen in the housing 10. When the processing of opening only the FIMS door 40 is not provided, for example, oxygen infiltrates from the first space 44*b* and the second space 44*c* into the FOUP, and the concentration of oxygen in the FOUP exceeds a target value. For example, the peak value of the $O_2$ concentration in the FOUP reaches 1000 ppm. Furthermore, the $O_2$ concentration in the EFEM may reach 200 ppm, but the $O_2$ concentration in the EFEM can be reduced by increasing the purge amount of $N_2$ in the EFEM. A specification in which the concentration of oxygen does not exceed a target value even when not only the FIMS door 40 is opened, but also the FOUP door 44B is opened may be applied to the space 10*a* of the housing 10.

Figure 9:
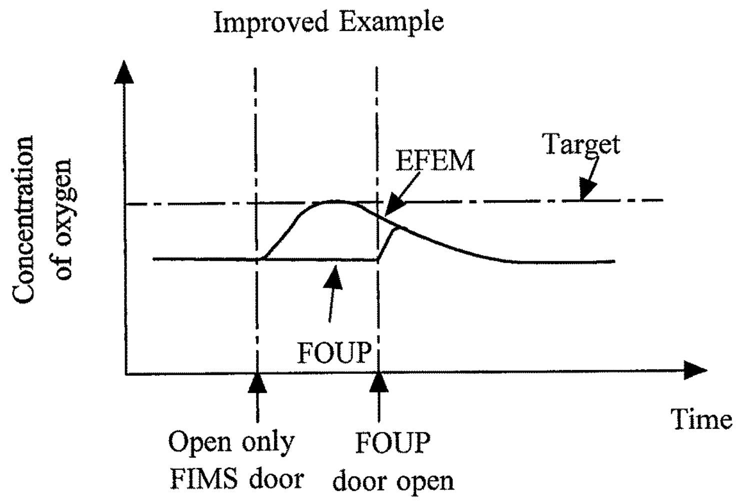
FIG. 9 is a diagram showing a transition of the concentration of oxygen.

FIG. 9 is a diagram showing a transition of the concentration of oxygen in the FOUP when only the FIMS door 40 is first opened, and then the FOUP door 44B is opened. The curve labeled "FOUP" in FIG. 9 represents a transition of the concentration of oxygen in FOUP. The curve labeled "EFEM" in FIG. 9 represents a transition of the concentration of oxygen in the housing 10. Since the processing of opening only the FIMS door 40 is executed, it is possible in some examples to suppress oxygen infiltrating into the FOUP due to opening the FOUP door 44B. Therefore, the substrate can be prevented from being exposed to an oxygen atmosphere of high concentration.

(Storage Medium)

Figure 10:
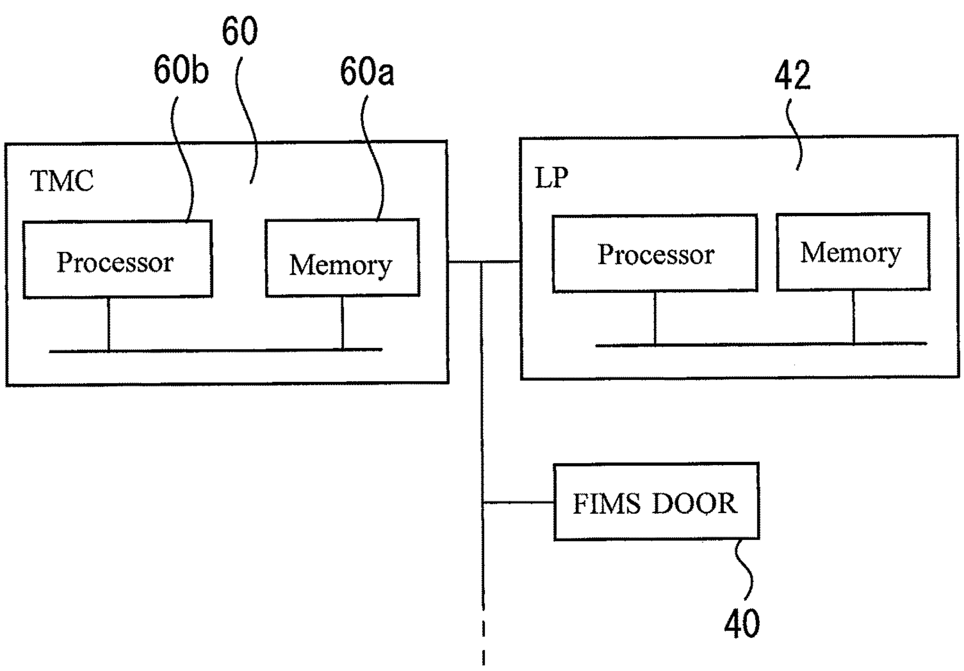
FIG. 10 is a diagram showing an exemplary configuration of hardware.

FIG. 10 is a diagram showing an exemplary configuration of hardware. The foregoing series of processing may be executed based on a program recorded in a computer-readable storage medium. Such a program is recorded in a storage medium 60*a* of a module controller 60, for example. The program recorded in the storage medium 60*a* causes a computer 60*b* configured by CPU to execute the following steps.

(1) The FOUP 44 placed on the load port 42 and having the FOUP door 44B is moved to the dock position to position the FOUP door 44B and the FIMS door 40 opposite to each other.

(2) When the FOUP 44 is located at the dock position of the load port 42, the FIMS door 40 is opened while the FOUP door 44B is closed.

Furthermore, the computer can be also caused to execute the following step.

(3) Inert gas is supplied into the FOUP 44 located at the undock position of the load port 42.

The module controller 60 may be caused to execute any optional step described above in addition to the foregoing steps (1) to (3). When the module controller 60 realizes the respective functions, existing load port operation commands may be merely changed so as to execute the foregoing processing. The foregoing processing may be executed by the storage medium of the load port 42 and the computer.

The controller for realizing the foregoing processing may be the module controller 60 or the load port 42. It may be selected whether the processing of opening only the FIMS door 40 is executed or the processing is executed as required every time a new FOUP 44 is placed on the load port 42. In this case, the controller selects a step of deactivating the function of the suction pad 40B and opening the FIMS door 40, or a step of activating the function of the suction pad 40B and opening the FIMS door 40. Furthermore, the controller may close the FIMS door 40 after the FIMS door 40 is opened while the FOUP door 44B is closed and then the concentration of oxygen in the module falls below a predetermined value. The concentration of oxygen in the module is measured by providing a sensor in the housing 10.

(Flowchart)

Figure 11:
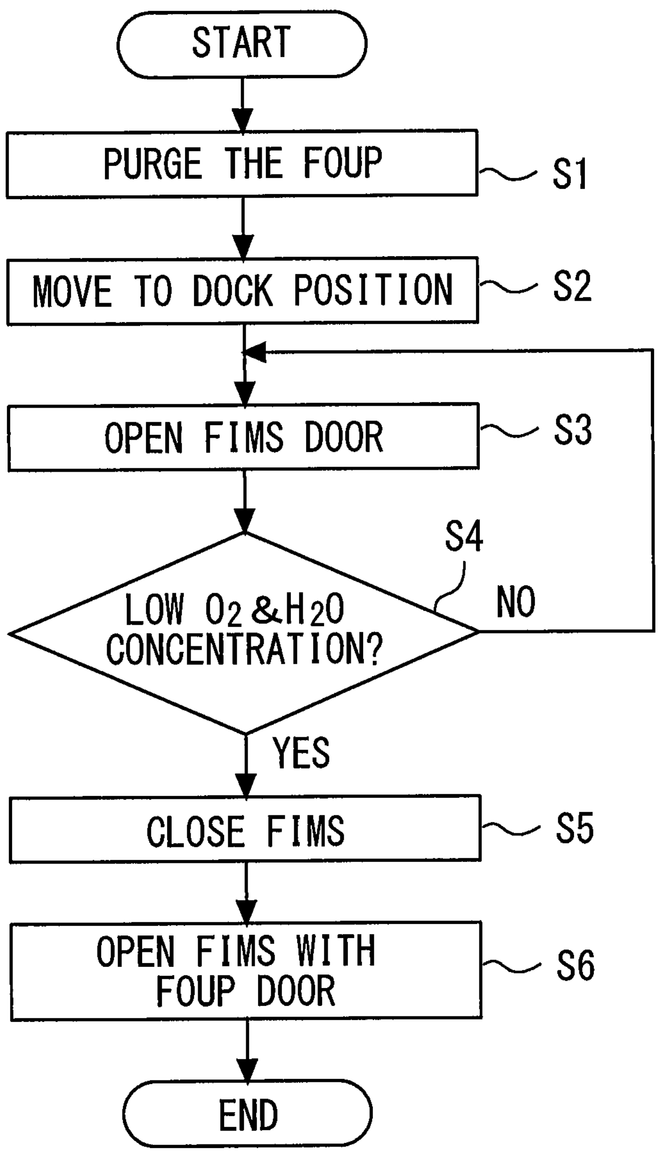
FIG. 11 is a flowchart showing an example of the substrate transporting method.

FIG. 11 is a flowchart showing an example of the substrate transporting method. In first step S1, the inside of the FOUP 44 is purged. Subsequently, in step S2, the FOUP 44 is moved to the dock position. Subsequently, in step S3, only the FIMS door 40 is opened, and for example, the first space 44*b* and the second space 44*c* are purged. Subsequently, in step S4, it is determined whether the concentration of oxygen and the concentration of water in the space 10*a* which is a space in the EFEM are equal to or less than predetermined values. The concentration of oxygen and the concentration of water in the space 10*a* may be detected, for example, by providing a sensor for measuring the concentration of oxygen and a sensor for measuring the concentration of water on the inner wall of the housing 10. The processing does not go to a next step unless the oxygen concentration of oxygen and the concentration of water in the space 10*a* are equal to or less than the predetermined values.

The processing goes to step S5 when it can be checked that the concentration of oxygen and the concentration of water in the space 10*a* are equal to or less than the predetermined values. In step S5, the FIMS door 40 is closed. Subsequently, in step S6, the FOUP door 44B is opened together with the FIMS door 40. Since it is guaranteed by the processing of step S4 that the concentration of oxygen and the concentration of water in the space 10*a* are left sufficiently low, the inside of the FOUP is prevented from being contaminated due to opening of the FOUP door 44B.

The invention claimed is:

1. A substrate transporting system comprising:
- a substrate transporting robot;
- a module that houses the substrate transporting robot therein and has an EFEM door;
- a load port for placing a FOUP having a FOUP door thereon; and
- a controller for opening the EFEM door while the FOUP door is closed when the FOUP is located at a dock position of the load port.

2. The substrate transporting system according to claim 1, further comprising a circulation device for circulating inert gas into the module.

3. The substrate transporting system according to claim 1, wherein the EFEM door has a suction pad to be sucked to the FOUP door, and the controller selects to deactivate a function of the suction pad and open the EFEM door, or to activate the function of the suction pad and open the EFEM door.

4. The substrate transporting system according to claim 1, wherein the controller closes the EFEM door after the EFEM door is opened while the FOUP door is closed and then an oxygen concentration in the module falls below a predetermined value.

5. The substrate transporting system according to claim 1, wherein the controller opens the EFEM door while the FOUP door is closed, whereby a first space in the FOUP door and a second space between the FOUP door and the EFEM door intercommunicate with a space in the module.

6. A computer-readable storage medium having a program recorded therein, the program causing a computer to execute:
- moving a FOUP placed on a load port and having a FOUP door to a dock position to position the FOUP door and an EFEM door opposite to each other; and
- opening the EFEM door while the FOUP door is closed when the FOUP is located at the dock position of the load port.

7. The storage medium according to claim 6, wherein the program causes the computer to further execute supplying inert gas into the FOUP located at an undock position of the load port.

8. A substrate transporting method comprising:
- moving a FOUP placed on a load port and having a FOUP door to a dock position to position the FOUP door and an EFEM door opposite to each other;
- opening the EFEM door while the FOUP door is closed when the FOUP is located at the dock position of the load port;
- closing the EFEM door;
- fixing the EFEM door to the FOUP door and opening the EFEM door and the FOUP door; and
- taking out a substrate in the FOUP by a substrate transporting robot provided in a housing.

9. The substrate transporting method according to claim 8, further comprising circulating inert gas into the housing.

10. The substrate transporting method according to claim 9, further comprising opening the EFEM door while the FOUP door is closed, whereby gas in a first space in the FOUP door and gas in a second space between the FOUP door and the EFEM door are replaced with the inert gas.

* * * * *